(12) United States Patent
Cheng et al.

(10) Patent No.: US 10,734,467 B2
(45) Date of Patent: Aug. 4, 2020

(54) DISPLAY DEVICE

(71) Applicant: Innolux Corporation, Miao-Li County (TW)

(72) Inventors: Pai-Chiao Cheng, Miao-Li County (TW); Hsia-Ching Chu, Miao-Li County (TW); Kuan-Feng Lee, Miao-Li County (TW); Chandra Lius, Miao-Li County (TW); Pei-Chieh Chen, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 101 days.

(21) Appl. No.: 15/942,452

(22) Filed: Mar. 31, 2018

(65) Prior Publication Data

US 2018/0308917 A1 Oct. 25, 2018

(30) Foreign Application Priority Data

Apr. 21, 2017 (CN) .......................... 2017 1 0265315

(51) Int. Cl.
| | |
|---|---|
| *H01L 27/32* | (2006.01) |
| *H01L 27/12* | (2006.01) |
| *G09G 3/3258* | (2016.01) |
| *G09G 3/34* | (2006.01) |

(52) U.S. Cl.
CPC ....... *H01L 27/3276* (2013.01); *G09G 3/3258* (2013.01); *G09G 3/34* (2013.01); *H01L 27/1214* (2013.01); *H01L 27/1244* (2013.01); *G09G 2310/0264* (2013.01)

(58) Field of Classification Search
CPC .............. H01L 27/124; H01L 27/3297; H01L 27/1244; H01L 27/3276–3279; G09G 3/3258; G09G 2310/0264–0297
See application file for complete search history.

(56) References Cited

U.S. PATENT DOCUMENTS

| | | | | |
|---|---|---|---|---|
| 7,538,488 B2* | 5/2009 | Kwak | ................ | H01L 27/3276 313/506 |
| 2004/0108132 A1* | 6/2004 | Ohazama | ............... | H05K 3/323 174/257 |
| 2006/0290829 A1* | 12/2006 | Kim | ................. | G02F 1/136209 349/44 |

(Continued)

*Primary Examiner* — Zandra V Smith
*Assistant Examiner* — Jeremy J Joy
(74) *Attorney, Agent, or Firm* — JCIPRNET

(57) ABSTRACT

A display device including a substrate, first and second reference voltage lines, a first insulation layer is provided. The first and second reference voltage lines are disposed in a peripheral area of the substrate. The first insulation layer having a groove is disposed on the first reference voltage line. The groove extends along a first direction and exposes a contact portion of the first reference voltage line. The first insulation layer covers a first covered portion of the first reference voltage line. The second reference voltage line contacts the contact portion at the groove and has a contact surface. In a second direction, a first width $W_1$ of the contact surface, a second width $W_2$ of the first reference voltage line and a third width $W_3$ of the first covered portion are complied with 1 $\mu m \leq W_1 \leq (W_2 - W_3)$, wherein than 0 and smaller than $W_2$.

19 Claims, 9 Drawing Sheets

(56) References Cited

U.S. PATENT DOCUMENTS

| | | | | |
|---|---|---|---|---|
| 2007/0065991 A1* | 3/2007 | Kim | G02F 1/13439 | 438/149 |
| 2010/0302221 A1* | 12/2010 | Okumoto | H01L 27/3246 | 345/204 |
| 2011/0102402 A1* | 5/2011 | Han | H01L 27/3279 | 345/211 |
| 2013/0307085 A1* | 11/2013 | Asai | H01L 27/088 | 257/390 |
| 2013/0328039 A1* | 12/2013 | Ohuchi | H01L 27/3244 | 257/40 |
| 2014/0252360 A1* | 9/2014 | Sakakura | H01L 29/78675 | 257/59 |
| 2014/0353670 A1* | 12/2014 | Youn | H01L 27/3288 | 257/72 |
| 2015/0185903 A1* | 7/2015 | Park | G06F 3/044 | 345/173 |
| 2015/0262536 A1* | 9/2015 | Chen | G09G 3/36 | 345/92 |
| 2015/0357354 A1* | 12/2015 | Hsu | H01L 29/7869 | 257/43 |
| 2016/0148951 A1* | 5/2016 | Yang | H01L 27/124 | 257/72 |
| 2016/0155792 A1* | 6/2016 | Wang | H01L 27/3276 | 257/40 |
| 2016/0190179 A1* | 6/2016 | Kim | G02F 1/1345 | 257/774 |
| 2016/0300834 A1* | 10/2016 | Yu | H01L 27/1225 | |
| 2016/0307934 A1* | 10/2016 | Yamazaki | H01L 27/0296 | |
| 2017/0012063 A1* | 1/2017 | Kwak | H01L 27/1218 | |
| 2017/0017328 A1* | 1/2017 | Tsai | G06F 3/0412 | |
| 2017/0047357 A1* | 2/2017 | Kwak | H01L 51/0097 | |
| 2017/0062546 A1* | 3/2017 | Kim | H01L 27/3276 | |
| 2017/0229527 A1* | 8/2017 | Baek | H01L 27/124 | |
| 2017/0317153 A1* | 11/2017 | Shin | H01L 27/3276 | |

* cited by examiner

DISPLAY DEVICE

CROSS-REFERENCE TO RELATED APPLICATION

This application claims the priority benefit of China application serial no. 201710265315.2, filed on Apr. 21, 2017. The entirety of the above-mentioned patent application is hereby incorporated by reference herein and made a part of this specification.

BACKGROUND OF THE DISCLOSURE

Field of the Disclosure

The disclosure relates to a display device.

Description of Related Art

Display devices have been widely applied to various electronic products in recent years. Along with popularity of the display devices, development of display technology continues to improve to achieve higher quality and higher stability. For example, in the display device, a layout design of a driving circuit generally may have a great impact on the display quality. A signal transmission line is further required to be adjusted according to different circuit layouts.

SUMMARY OF THE DISCLOSURE

The disclosure is directed to a display device, and the display device with good quality is provided through a layout design of components.

An embodiment of the disclosure provides a display device including a substrate, a first reference voltage line, a first insulation layer and a second reference voltage line. The substrate includes a display area and a peripheral area. The peripheral area is located adjacent to the display area. The first reference voltage line is disposed on the substrate and located in the peripheral area. The first reference voltage line extends along a first direction, wherein the first reference voltage line has a contact portion and a first covered portion, and the first covered portion is located between the contact portion and the display area. The first insulation layer is disposed on the first reference voltage line, and the first insulation layer has a groove. The groove extends along the first direction. The groove exposes the contact portion. The first insulation layer covers the first covered portion. The second reference voltage line is disposed on the first reference voltage line and located in the peripheral area. The second reference voltage line extends along the first direction and at least partially overlapped with the first reference voltage line. The second reference voltage line contacts the contact portion of the first reference voltage line at the groove and has a contact surface. A second direction is perpendicular to the first direction, a first width of the contact surface in the second direction is $W_1$ μm, a second width of the first reference voltage line in the second direction is $W_2$ μm, a third width of the first covered portion in the second direction is $W_3$ μm. $W_1$, $W_2$, $W_3$ are complied with a relational expression: $1\,\mu m \leq W_1 \leq (W_2 - W_3)$, and $W_3$ is greater than 0 and smaller than $W_2$.

The display device of the embodiment of the disclosure has good display quality.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
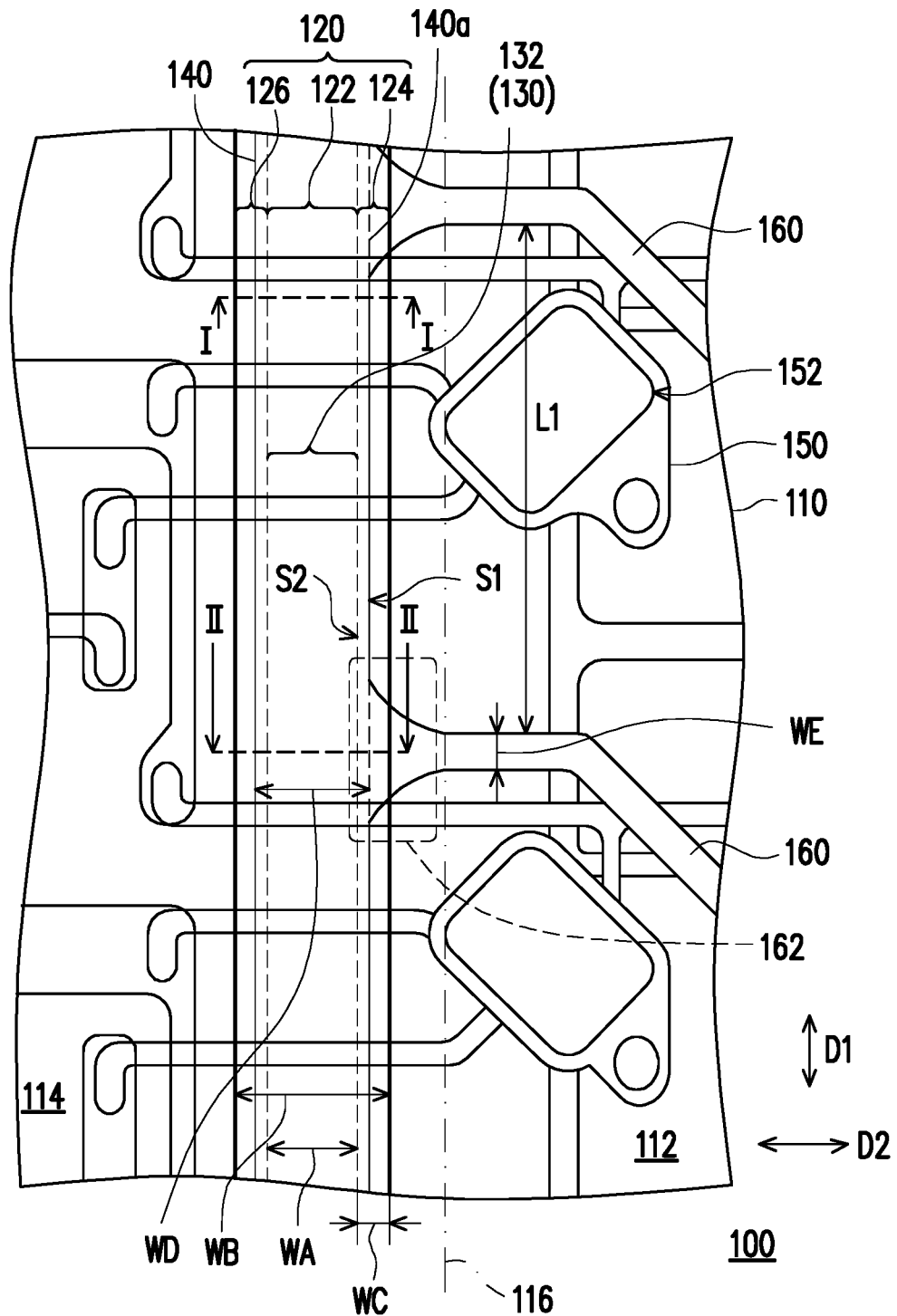
FIG. 1 is a partial top view of a display device according to an embodiment of the disclosure.

In the disclosure, a situation that one structure (or a layer, a component, a substrate) is located on another structure (a layer, a component, a substrate) may refer to that the two structures are located adjacent to each other and directly connected to each other, and a lower surface of one structure is located adjacent to and directly connected to an upper surface of the other structure, or may refer to that the two structures are located adjacent to each other without directly connecting each other, and at least one intermediary structure (or an intermediary layer, an intermediary component, an intermediary substrate, an intermediary interval) exists between the two structures, and the lower surface of one structure is located adjacent to and directly connected to an upper surface of the intermediary structure, and an upper surface of the other structure is located adjacent to and directly connected to a lower surface of the intermediary structure, and the intermediary structure may be a single layer or multi-layer physical structure or a non-physical structure, which is not limited by the disclosure.

The electrical connections or couplings mentioned in the disclosure may all refer to direct connections or indirect connections, and in the case of the direct connection, terminals of two circuit components are directly connected or connected through a conductive line, and in the case of the indirect connection, a combination of at least one of a switch, a diode, a capacitor, an inductor or other non-conductive line component and at least one conductive line or a resistor, or a combination of at least two of the above components and at least one conductive line or a resistor are configured between the terminals of the two circuit components.

In the disclosure, any two values or directions used for comparison may have a certain error. If a first value is equal to a second value, it means that the first value and the second value may have an error of 10% therebetween; and if a first direction is perpendicular to a second direction, it means that an angle between the first direction and the second direction may be between 80 degrees and 100 degrees; and if the first direction is parallel to the second direction, it means that the angle between the first direction and the second direction may be between 0 degree and 10 degrees.

In the disclosure, a light-emitting component may include a light-emitting layer. "A lighting color" of the light-emitting layer refers to a color perceived by an observer after an electromagnetic radiation produced by a current flows through the light-emitting layer located between two electrodes is received by an eye of an observer, and now different lighting colors correspond to different colors. Alternatively, the electromagnetic radiation may be not a visible light, which may be measured by an instrument to obtain a corresponding frequency spectrum, and different lighting colors correspond to different frequency spectrums.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
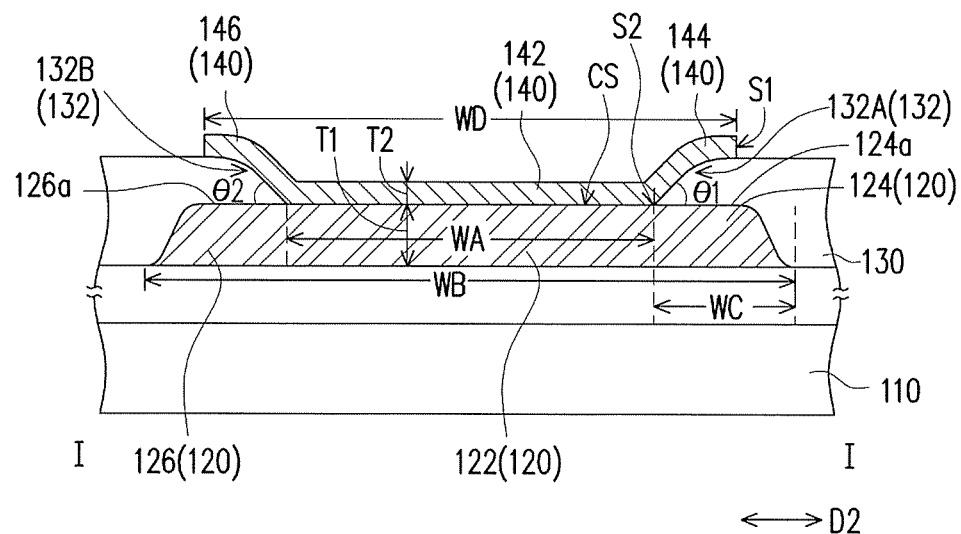
FIG. 2 is a cross-sectional view of the display device of FIG. 1 along a section line I-I.

FIG. 1 is a partial top view of a display device according to an embodiment of the disclosure, and FIG. 2 is a cross-sectional view of the display device of FIG. 1 along a section line I-I. Referring to FIG. 1 and FIG. 2, the display device 100 includes a substrate 110, a first reference voltage line 120, a first insulation layer 130 and a second reference voltage line 140. The substrate 110 includes a display area 112 and a peripheral area 114, where the peripheral area 114 is located adjacent to the display area 112. In FIG. 1, the display area 112 and the peripheral area 114 are, for example, divided by a boundary 116, and located at two sides of the boundary 116. The first reference voltage line 120 is disposed on the substrate 110 and located in the peripheral area 114. The first insulation layer 130 is disposed in the display area 112 and the peripheral area 114, and the first insulation layer 130 is disposed on the first reference voltage line 120, and has a groove 132. The second reference voltage line 140 is disposed on the first reference voltage line 120 and located in the peripheral area 114. To be specific, in the present embodiment, a part of the second reference voltage line 140 is disposed on the first reference voltage line 120, and a part of the second reference voltage line 140 is disposed on the insulation layer 130. According to FIG. 1, it is known that the first reference voltage line 120 extends along a first direction D1. Meanwhile, the groove 132 of the first insulation layer 130 may be a slit type groove structure, and extend along the first direction D1. The second reference voltage line 140 also extends along the first direction D1 and is at least partially overlapped with the first reference voltage line 120.

According to FIG. 1 and FIG. 2, it is known that the groove 132 of the first insulation layer 130 is a structure penetrating through the first insulation layer 130 and exposes a part of the first reference voltage line 120, so that a part of the area of the first reference voltage line 120 is not covered by the first insulation layer 130, and the first reference voltage line 120 exposed by the groove 132 is a contact portion 122 of the first reference voltage line 120.

The second reference voltage line 140 has a part of area covering the groove 132 to contact the first reference voltage line 120. In other words, the second reference voltage line 140 contacts the contact portion 122 of the first reference voltage line 120 in the groove 132, where one side of the second reference voltage line 140 actually contacting the contact portion 122 has a contact surface CS. Moreover, besides the contact portion 122 exposed by the groove 132, the first reference voltage line 120 further includes a first covered portion 124 covered by the first insulation layer 130. Referring to FIG. 1 and FIG. 2, it is known that the first covered portion 124 is located between the contact portion 122 and the display area 112 in a normal direction of the substrate 110. Namely, the first covered portion 124 is located at one side of the contact portion 122 that is closer to the display area 112.

The first reference voltage line 120 and the second reference voltage line 140 overlapped with each other are partially contacted, so that a reference signal may be transmitted through the contact surface CS between the first reference voltage line 120 and the second reference voltage line 140, which avails improving a signal transmission quality. A sufficient contact area (i.e. an area of the contact surface CS) between the first reference voltage line 120 and the second reference voltage line 140 may avail decreasing a contact impedance therebetween, and decreasing depletion of a current transmitted therebetween, or ensuring that the two reference voltage lines are not easy to be peeled off. In the present embodiment, the first direction D1 and a second direction D2 are, for example, defined at a plane parallel to an upper surface of the substrate, and the second direction D2 is substantially perpendicular to the first direction D1 on the plane. A first width WA of the contact surface CS in the second direction D2 is $W_1$ μm, a second width WB of the first reference voltage line 120 in the second direction D2 is $W_2$ μm, a third width WC of the first covered portion 124 in the second direction D2 is $W_2$ μm, and $W_1$, $W_2$, $W_3$ are complied with a relational expression: 1 μm≤$W_1$≤($W_2$−$W_3$), where $W_3$ is greater than 0 and smaller than $W_2$. The first width WA, the second width WB and the third width WC are, for example, widths measured along a virtual line (for example, the section line I-I) in the second direction D2 in the above figure (FIG. 1), or widths measured in a cross section (for example, FIG. 2) of the first reference voltage line 120 taken along the second direction D2. In detail, the contact surface CS is located adjacent to an upper surface of the first reference voltage line 120, and has the first width WA in the second direction D2. The second width WB of the first reference voltage line 120 may be regarded as the width of the first reference voltage line 120 measured in the second direction D2 in the top view diagram, and may also be regarded as the width of the first reference voltage line 120 measured in the second direction D2 in the cross-sectional view diagram. The third width WC of the first covered portion 124 may be a width between a second side S2 of the groove 132 close to the display area 112 and a side of the first reference voltage line 120 close to the display area 112. Since a magnitude of the first width WA is probably limited by manufacturing equipment and capability of a manufacturing method, in the present embodiment, 1 μm≤$W_1$≤($W_2$−$W_3$). Moreover, since the reference signal may be transmitted through the contact surface CS between the first reference voltage line 120 and the second reference voltage line 140, the first width WA of the contact surface CS has to be enough in order to improve the signal transmission quality, the third width WC of the first covered portion 124 should not exceeds ⅓ of the second width WB of the first reference voltage line 120, and in an embodiment, $W_3$ is greater than 0 and smaller than $W_2/3$. In an embodiment, $W_3$ is greater than 0 and smaller than 20, in an embodiment, $W_3$ is greater than 0 and smaller than 10, and in an embodiment, $W_3$ is 0.5, though the disclosure is not limited thereto. Moreover, in the case that $W_1 < (W_2 - W_3)$, at one side of the contact portion 122 farther from the display area 112, another part of the first reference voltage line 120 may also be covered by the first insulation layer 130 to serve as a second covered portion 126. In other words, the first reference voltage line 120 further includes the second covered portion 126, and the first covered portion 124 and the second covered portion 126 are covered by the first insulation layer 130 and located at two opposite sides of the contact portion 122. In the case that $W_1 = (W_2 - W_3)$, the first reference voltage line 120 may not have the second covered portion 126. Moreover, the first width $W_1$ may be substantially equal to a width of a bottom portion of the groove 132 in the second direction D2.

According to FIG. 1 and FIG. 2, it is known that the second reference voltage line 140 has a fourth width WD in the second direction D2. In the present embodiment, the fourth width WD is greater than the first width WA of the contact surface CS to ensure a full contact of the second reference voltage line 140 and the first reference voltage line 120 through contact surface CS. Meanwhile, the fourth width WD may be smaller than the second width WB of the first reference voltage line 120, though the disclosure is not limited thereto. In other embodiments, the fourth width WD may be selectively equal to or greater than the second width WB of the first reference voltage line 120.

In the present embodiment, the first reference voltage line 120 and the second reference voltage line 140 are all made of a conductive material. The applicable conductive materials include a metal material, a metal alloy, a conductive oxide, an organic conductive material, etc, but the disclosure is not limited thereto. Taking the metal material as an example, the metal material used for making the first reference voltage line 120 and the second reference voltage line 140 is a solid-state metal material, for example, aluminium, molybdenum, copper, gold, silver or other applicable solid-state metal materials of the field. The metal alloy may be a magnesium aluminium alloy or other applicable metal alloys of the field. The conductive oxide is, for example, zinc oxide, tin dioxide, indium tin oxide or indium oxide, etc. The organic conductive material includes a conductive polymer, a nanocarbon material or grapheme, etc. Moreover, the first reference voltage line 120 has a first thickness T1, and the second reference voltage line 140 has a second thickness T2. On the cross-section (for example, FIG. 2) of the first reference voltage line 120 taken in the second direction D2, the first thickness T1 and the second thickness T2 are substantially measured at the point corresponding to a central region of the contact portion 122. Namely, the first thickness T1 is, for example, a thickness of the contact portion 122, and the second thickness T2 is, for example, a thickness of the second reference voltage line 140 above the contact portion 122. In an embodiment, the first reference voltage line 120 may be made of a film layer in the display device 100 serving as a signal transmission line, and the second reference voltage line 140 may be made of a film layer in the display device 100 serving as a reflection layer, and the film layer of the reflection layer is thinner than the film layer of the signal transmission line, so that the first thickness T1 may be greater than the second thickness T2. However, when the film layers forming the first reference voltage line 120 and the second reference voltage line 140 are other combinations, a relationship between the first thickness T1 and the second thickness T2 may be accordingly changed.

As shown in FIG. 1 and FIG. 2, on a cross-section taken in the first direction D2, the groove 132 has an inner sidewall 132A close to the display area 112, where the inner sidewall 132A is disposed corresponding to the first covered portion 124, and the second reference voltage line 140 extends from the bottom portion of the groove 132 towards the display area 112 to continuously cover the inner sidewall 132A. Therefore, the second reference voltage line 140 has a first side S1, the bottom portion of the groove 132 has a second side S2, and the first side S1 and the second side S2 are located at the same side of the groove 132 that is adjacent to the display area 112, where the first side S1 is closer to the display area 112 compared to the second side S2. In other words, the first side S1 is located between the second side S2 and the display area 112 in the normal direction of the substrate 110. On the other side of the groove 132, the groove 132 has an outer sidewall 132B located farther from the display area 112, and the outer sidewall 132B is disposed corresponding to the second covered portion 126, and the second reference voltage line 140 extends from the bottom portion of the groove 132 to depart from the display area 112 and continuously cover the outer sidewall 132B. In this way, the second reference voltage line 140 may fully contact the first reference voltage line 120 through the contact surface CS.

In other words, in the present embodiment, the second reference voltage line 140 may include a middle portion 142, an inner portion 144 and an outer portion 146, where the middle portion 142 is located in the groove 132 and contacts the first reference voltage line 120, and the inner portion 144 and the outer portion 146 are respectively located at two sides of the middle portion 142 and are disposed on the first insulation layer 130. The inner portion 144 covers the inner sidewall 132A of the groove 132, and the inner portion 144 is located between the middle portion 142 and the display area 112 in the normal direction of the substrate 110. Meanwhile, the outer portion 146 covers the outer sidewall 132B of the groove 132. However, in other embodiments, the second reference voltage line 140 may selectively not cover the outer sidewall 132B, and does not have the outer portion 146.

According to FIG. 2, it is known that on a cross-section of FIG. 1 in the second direction D2, the inner sidewall 132A and the outer sidewall 132B of the groove 132 are respectively an inclined sidewall. Namely, the inner sidewall 132A has a first tilt angle θ1 relative to a surface 124a of the first covered portion 124, and the surface 124a of the first covered portion 124 is located adjacent to the inner sidewall 132A, and the outer sidewall 132B has a second tilt angle θ2 relative to a surface 126a of the second covered portion 126, and the surface 126a of the second covered portion 126 is located adjacent to the outer sidewall 132B. The first tilt angle θ1 may be different to the second tilt angle θ2. The first tilt angle θ1 and the second tilt angle θ2 may all be non-right angles, or at least one of the first tilt angle θ1 and the second tilt angle θ2 is the non-right angle. Moreover, the first tilt angle θ1 may be selectively smaller than the second tilt angle θ2. When the first tilt angle θ1 is smaller than the second tilt angle θ2, it avails continuous extending of the second reference voltage line 140 along the inner sidewall 132A from the bottom portion of the groove 132, and the second reference voltage line 140 is not liable to have a line breaking phenomenon, which avails improving the quality of the display device 100. Moreover, the groove 132 has a groove length in the first direction D1, and has a groove width in the second direction D2. According to FIG. 1, it is known that the groove 132 substantially extends along the first reference voltage line 120 continuously, so that the groove length is obviously greater than the groove width.

In the display area 112, as shown in FIG. 1, the display device 100 may further include a light-emitting component 150, which, for example, emits a display light to implement a display function. To be specific, a plurality of light-emitting components 150 may be configured in the display device 100, and the light-emitting components 150 are arranged in the display area 112 in an array, and only two of the light-emitting components 150 disposed at the edge of the display area 112 are illustrated in FIG. 1. Each of the light-emitting components 150 respectively has a light-emitting region 152. Taking the light-emitting component 150 disposed at the edge of the display area 112 as an example, the boundary 116 of the display area 112 and the peripheral area 114 may be partially overlapped to a profile of the light-emitting region 152 close to the peripheral area 114. For example, the profiles of the two light-emitting regions 152 of FIG. 1 respectively have an endpoint closest to the peripheral area 114 (such endpoint may also be a tangent point of the profile of the light-emitting region 152 closest to the peripheral area 114), and an extending line of a connection line of the two endpoints is defined as the boundary 116. In an embedment, the light-emitting component 150 may be composed of two electrode layers and a light-emitting layer disposed there between, and the light-emitting layer may be made of an organic material. In other words, the light-emitting component 150 may be an organic light-emitting diode (OLED), though the disclosure is not limited thereto. In other implementations, the light-emitting components 150 may comprise quantum dots, color filters, light-emitting diodes (LED), mini light-emitting diodes (mini LED), micro light-emitting diodes (micro LED), or other display medium to provide a required display effect. In some embodiments, a chip size of the LED is about 300 μm to 10 mm, a chip size of the mini LED is about 100 μm to 300 μm, and a chip size of the micro LED is about 1 μm to 100 μm, but the present embodiment is not limited thereto. Moreover, in order to clearly present the components of the first reference voltage line 120 and the second reference voltage line 140 in the figures, a part of the components of the display device 100 is omitted in FIG. 1 and FIG. 2. In a specific implementation, the display device 100 may further include related structures of a driving circuit, for example, transistor structures, a capacitor structures, related signal lines (scan lines, data lines, a power line, a capacitor electrode line, etc.).

Figure 3:
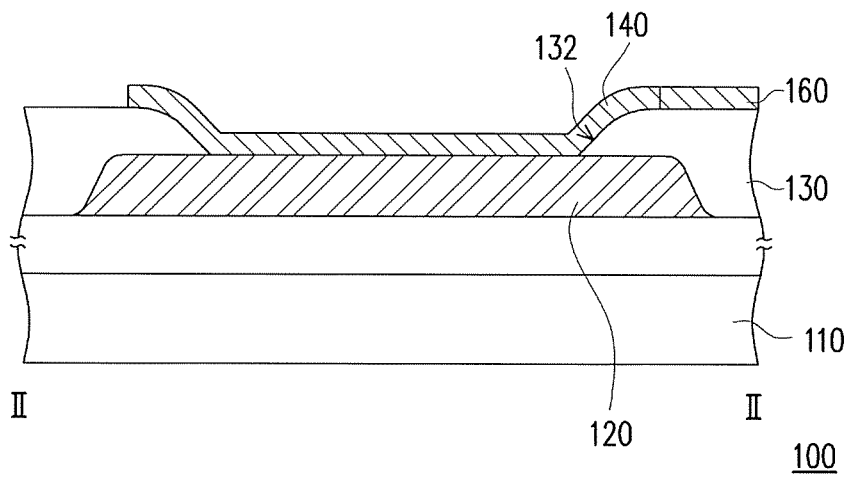
FIG. 3 is a cross-sectional view of the display device of FIG. 1 along a section line II-II.

In the present embodiment, the first reference voltage line 120 and the second reference voltage line 140 substantially transmits a voltage used for initializing the light-emitting component 150, such that the light-emitting component 150 may send a preset signal. Therefore, in order to transfer a reference signal (for example, a reference voltage) transmitted by the first reference voltage line 120 and the second reference voltage line 140 to the display area 112, the display device 100 further includes a plurality of third reference voltage lines 160. Referring to FIG. 1 and FIG. 3, where FIG. 3 is a cross-sectional view of the display device of FIG. 1 along a section line II-II. The third reference voltage lines 160 are disposed on the first insulation layer 130, and the third reference voltage lines 160 are respectively connected to the second reference voltage line 140 and extend from the peripheral area 114 to the display area 112, and a main extending direction of the third reference voltage lines 160 is the second direction D2. In the present embodiment, the third reference voltage lines 160 and the second reference voltage line 140 are made of the same film layer, and have a continuous configuration without having an obvious boundary, though an edge 140a of the second reference voltage line 140 may be substantially a straight line. Namely, at a place where the third reference voltage line 160 is connected to the second reference voltage line 140, the edge 140a of the second reference voltage line 140 is, for example a dotted line shown in FIG. 1. Moreover, a line width of the second reference voltage line 140 in the second direction D2 may be greater than a line width of at least one of the third reference voltage lines 160 in the first direction D1. The so-called line width may be regarded as line width measured along a direction perpendicular to the extending direction of the line. Regarding the second reference voltage line 140 extending along the first direction D1, the line width of the second reference voltage line 140 may be the fourth width WD of the second reference voltage line 140 in the second direction D2. For example, the fourth width WD of the second reference voltage line 140 may be regarded as the fourth width WD of the second reference voltage line 140 in the second direction D2 in the top view diagram, or regarded as the fourth width WD of a projection of the second reference voltage line 140 in the second direction D2 in the cross-sectional view diagram. Regarding the third reference voltage line 160 substantially extending along the second direction D2, the line width of the third reference voltage line 160 may be a fifth width WE of the third reference voltage line 160 in the first direction D1. For example, the third reference voltage line 160 substantially extends along the second direction D2, which may be a wavy line (or a curved line), and the line width of the third reference voltage line 160 may be the fifth width WE of a part of the wavy line substantially extending along the second direction D2 in the first direction D1 (as shown in FIG. 1). In the present embodiment, the fourth width WD is greater than the fifth width WE, though the disclosure is not limited thereto. Moreover, according to FIG. 1, it is known that the third reference voltage line 160 may have a varied width, where one end of the third reference voltage line 160 located adjacent to the second reference voltage line 140 may have a widened widening portion 162, which avails a connection between the second reference voltage line 140 and the third reference voltage line 160 to avoid the line breaking phenomenon. In an embodiment, two adjacent third reference voltage lines 160 are spaced by a first distance L1. In detail, the third reference voltage line 160 has a partial line substantially extending along the second direction D2 to connect the widening portion 162, and two adjacent partial lines substantially extending along the second direction D2 have the first distance L1 therebetween. In other words, the first distance L1 is a distance between two closed sides of the two adjacent lines partially extending along the second direction D2 substantially (as shown in FIG. 1). Moreover, in the present embodiment, the groove 132 of the first insulation layer 130 is a slit type groove extending along the whole first reference voltage line 120, so that the groove 132 may correspond to multiple third reference voltage lines 160. In other words, a groove length of the groove 132 in the first direction D1 is greater than the first distance L1 between two adjacent third reference voltage lines 160.

Figure 4:
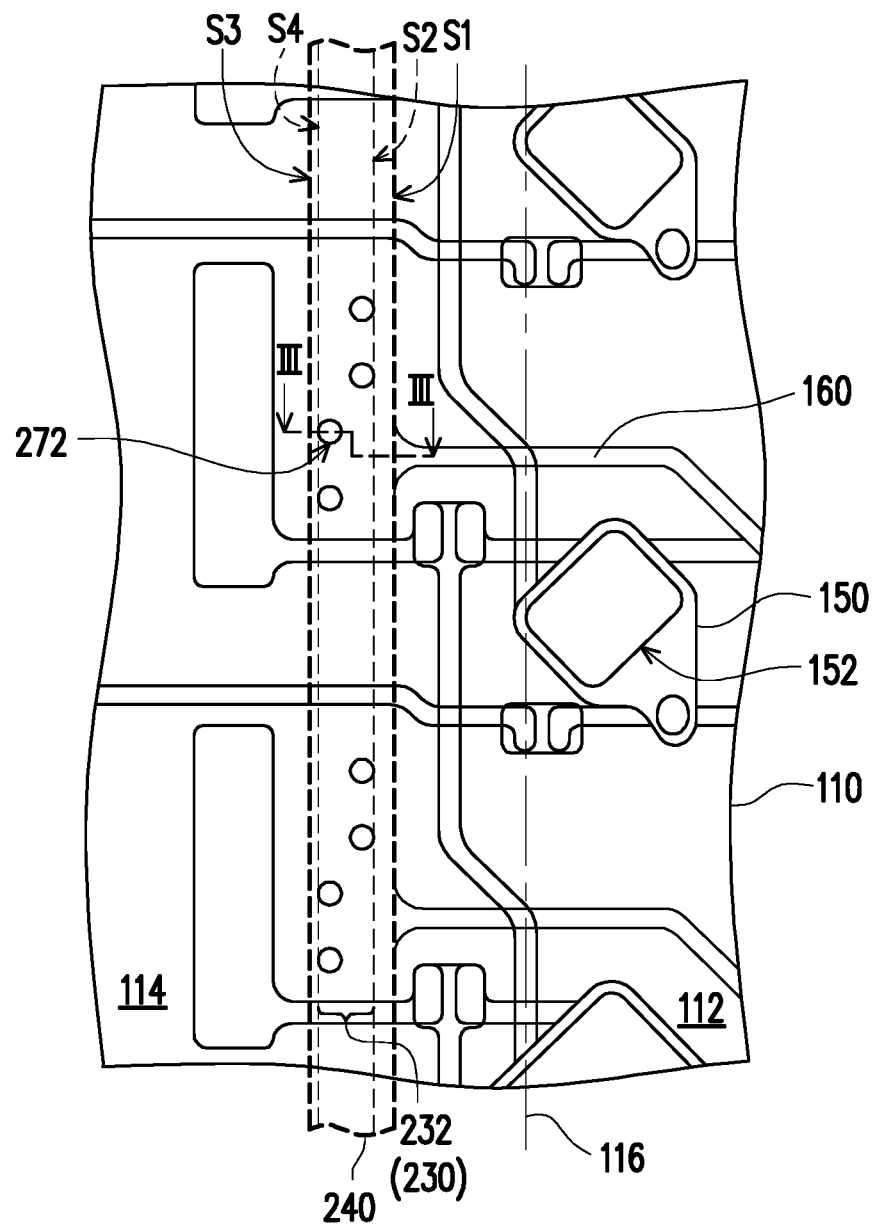
FIG. 4 is a partial top view of a display device according to another embodiment of the disclosure.
Figure 5:
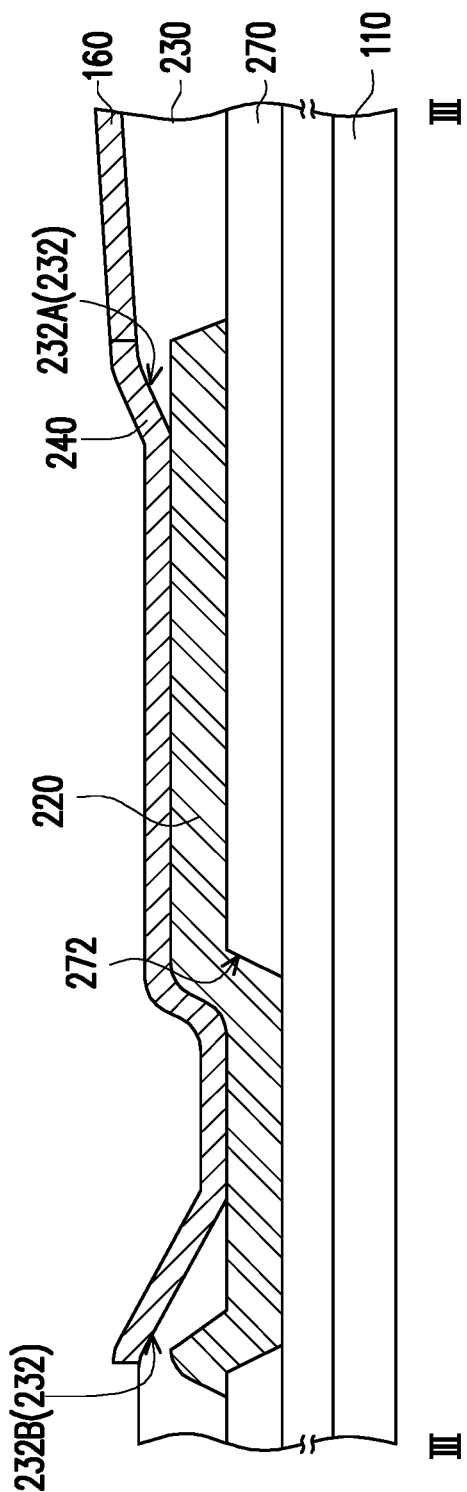
FIG. 5 is a cross-sectional view of the display device of FIG. 4 along a section line III-III.

FIG. 4 is a partial top view of a display device according to another embodiment of the disclosure, and FIG. 5 is a cross-sectional view of the display device of FIG. 4 along a section line III-III. Referring to FIG. 4 and FIG. 5, the display device 200 includes a substrate 110, a first reference voltage line 220, a first insulation layer 230, a second reference voltage line 240, light-emitting components 150, a plurality of third reference voltage lines 160 and a second insulation layer 270. The substrate 110 includes a display area 112 and a peripheral area 114, where the peripheral area 114 is located adjacent to the display area 112. In FIG. 4, the display area 112 and the peripheral area 114 are, for example, divided by a boundary 116, and the boundary 116 may be partially overlapped to a profile of the light-emitting region 152 of the light-emitting component 150 close to the peripheral area 114. For example, the profiles of the two light-emitting regions 152 of FIG. 1 respectively have an endpoint closest to the peripheral area 114 (such endpoint may also be a tangent point of the profile of the light-emitting region 152 closest to the peripheral area 114), and an extending line of a connection line of the two endpoints is defined as the boundary 116. The second insulation layer 270 is disposed on the substrate 110. The first reference voltage line 220 is disposed on the second insulation layer 270 and located in the peripheral area 114. The first insulation layer 230 is disposed in the display area 112 and the peripheral area 114, and the first insulation layer 230 is disposed on the first reference voltage line 220, and has a groove 232. The second reference voltage line 240 is disposed on the first reference voltage line 220 and located in the peripheral area 114. In other words, in the present embodiment, a part of the second reference voltage line 240 is disposed on the first reference voltage line 220, and the other part of the second reference voltage line 240 is disposed on the first insulation layer 230. The second reference voltage line 240 contacts the first reference voltage line 220 in the groove 232. The third reference voltage lines 160 are connected to the second reference voltage line 240 and extend to the display area 112, so as to transfer a reference signal transmitted by the second reference voltage line 240 to the display area 112.

In the present embodiment, line widths of the first reference voltage line 220 and the second reference voltage line 240 are substantially the same, or the line width of the first reference voltage line 220 is slightly smaller than the line width of the second reference voltage line 240, so that in the top view diagram of FIG. 4, only the second reference voltage line 240 is substantially viewed. Meanwhile, a width of the groove 232 is smaller than the line width of the second reference voltage line 240, and the groove 232 is a structure penetrating through the first insulation layer 230, so as to facilitate the second reference voltage line 240 to contact the first reference voltage line 220 in the groove 232.

The second insulation layer 270 is disposed between the first reference voltage line 220 and the substrate 110 and has a through hole 272. The through hole 272 is substantially overlapped with at least a part of the groove 232. Namely, an area of the through hole 272 may be completely overlapped with the groove 232 or partially overlapped with the groove 232. A part of the first reference voltage line 220 and a part of the second reference voltage line 240 are disposed in the through hole 272. According to FIG. 5, it is known that the first reference voltage line 220 and the second reference voltage line 240 are recessed towards the substrate 110 in accordance with a structure of the through hole 272 at the through hole 272. Therefore, the first reference voltage line 220 and the second reference voltage line 240 are not easy to be peeled off, so as to reduce an influence on an initialization operation caused by increase of a transmission impedance after peel off. Moreover, in FIG. 5, a location of the through hole 272 is adjacent to one side of the groove 232 farther from the display area 112, though the disclosure is not limited thereto. In FIG. 4, the number of the through holes 272 may be plural, and a part of the through holes 272 may be located at one side of the groove 232 close to the display area 112.

In the present embodiment, the groove 232 may include an inner sidewall 232A and an outer sidewall 232B located at two opposite sides thereof, where the inner sidewall 232A is closer to the display area 112. Meanwhile, an inclination of the inner sidewall 232A may be different to an inclination of the outer sidewall 232B. The more gentle inclination of the inner sidewall 232A avails continuous extending of the second reference voltage line 240 on the inner sidewall 232A, so as to prevent the line breaking phenomenon of the second reference voltage line 240. Namely, the second reference voltage 240 may continuously extend from the bottom portion of the groove 232 towards the display area 112 to cover the inner sidewall 232A.

According to FIG. 4, it is known that the bottom portion of the groove 232 is shifted with respect to the second reference voltage line 240. To be specific, at one side of the groove 232 close to the display area 112, the second reference voltage line 240 has a first side S1, the bottom portion of the groove 232 has a second side S2, and the first side S1 is closer to the display area 112 compared to the second side S2. In other words, the first side S1 is located between the second side S2 and the display area 112 in the normal direction of the substrate 110. Meanwhile, at one side of the groove 232 farther from the display area 112, the second reference voltage line 240 has a third side S3, the bottom portion of the groove 232 has a fourth side S4, and the third side S3 is further farther from the display area 112 compared to the fourth side S4. A space between the first side S1 and the second side S2 is greater than a space between the third side S3 and the fourth side S4, though the disclosure is not limited thereto. In other embodiments, the space between the first side S1 and the second side S2 may be equal to or smaller than the space between the third side S3 and the fourth side S4.

Figure 6:
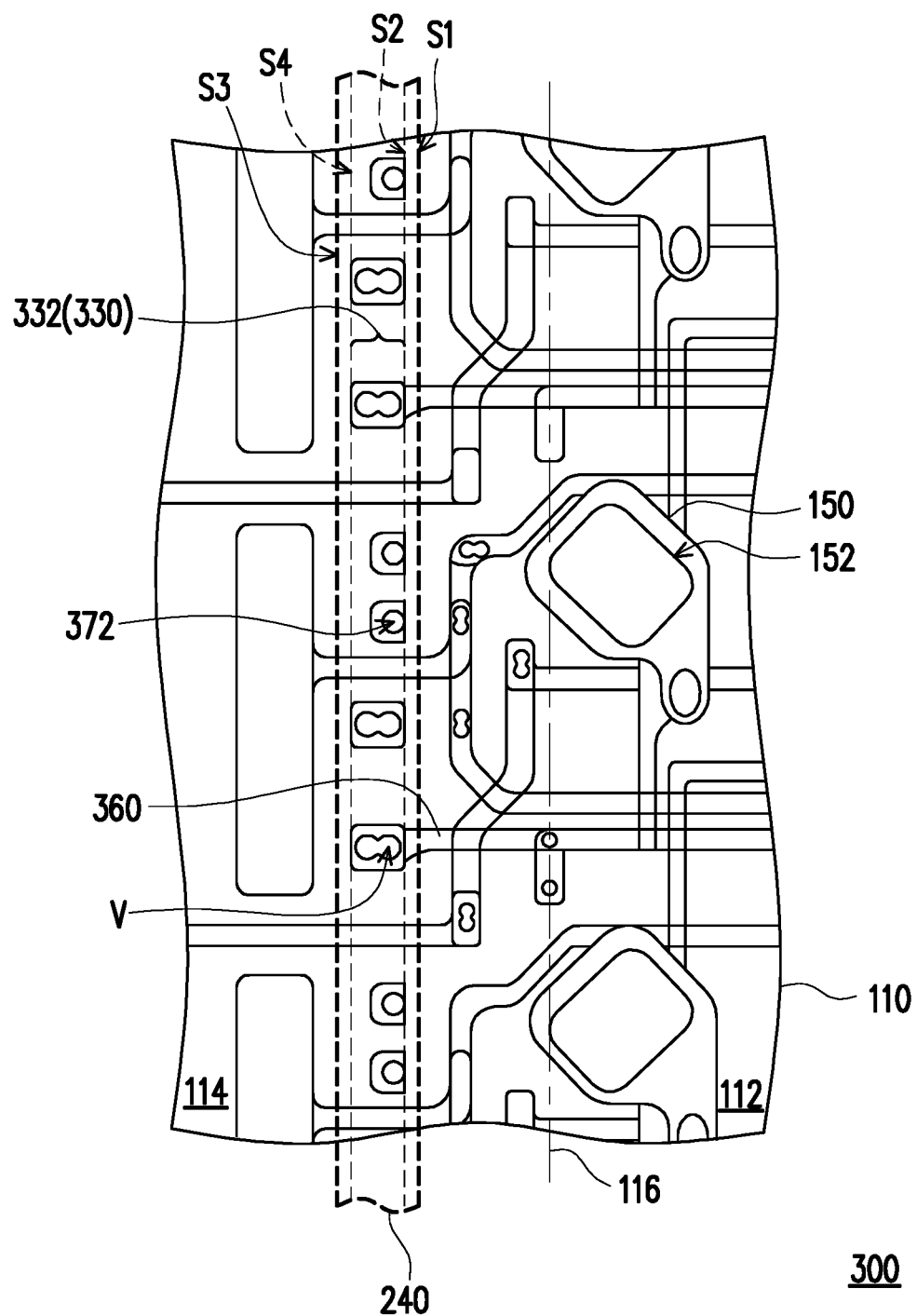
FIG. 6 is a partial top view of a display device according to still another embodiment of the disclosure.

FIG. 6 is a partial top view of a display device according to still another embodiment of the disclosure. Referring to FIG. 6, a part of components in the display device 300 is similar to that of the display device 200, so that the same reference numbers are used in the two embodiments to refer to the parts having the same or similar structures. To be specific, the display device 300 includes a substrate 110, a first reference voltage line 220, a first insulation layer 330, a second reference voltage line 240, light-emitting components 150 and a plurality of third reference voltage lines 360. The substrate 110 includes a display area 112 and a peripheral area 114, where the peripheral area 114 is located adjacent to the display area 112. The display area 112 and the peripheral area 114 are, for example, divided by a boundary 116, and the boundary 116 may be partially overlapped to a profile of the light-emitting region 152 of the light-emitting component 150 close to the peripheral area 114. For example, the profiles of the two light-emitting regions 152 of FIG. 1 respectively have a point closest to the peripheral area 114 (such point may be a tangent point of a corner of the profile of the light-emitting region 152 closest to the peripheral area 114), and an extending line of a connection line of the two points may be defined as the boundary 116. The first reference voltage line 220 is disposed on the substrate 110 and located in the peripheral area 114. In the present embodiment, line widths of the first reference voltage line 220 and the second reference voltage line 240 are substantially the same, or the line width of the first reference voltage line 220 is slightly smaller than the line width of the second reference voltage line 240, so that in the top view diagram of FIG. 6, only the second reference voltage line 240 is seen. The first insulation layer 330 is disposed in the display area 112 and the peripheral area 114, and the first insulation layer 330 is disposed on the first reference voltage line 220, and has a groove 332. The second reference voltage line 240 is disposed on the first reference voltage line 220 and located in the peripheral area 114. In other words, in the present embodiment, a part of the second reference voltage line 240 is disposed on the first reference voltage line 220, and the other part of the second reference voltage line 240 is disposed on the first insulation layer 330. The second reference voltage line 240 contacts the first reference voltage line 220 in the groove 332. The third reference voltage lines 360 substantially extends along the second direction D2, and the third reference voltage lines 360 are electrically connected to the second reference voltage line 240 and extend to the display area 112 from the peripheral area 114, so as to transfer a reference signal transmitted by the second reference voltage line 240 to the display area 112.

To be specific, the bottom portion (i.e. the contact surface of the first reference voltage line 220 and the second reference voltage line 240) of the groove 332 in the first insulation layer 330 of the display device 300 is not shifted with respect to the second reference voltage line 240, and is substantially disposed at a center portion of the second reference voltage line 240. To be specific, at one side of the groove 332 close to the display area 112, the second reference voltage line 240 has a first side S1, the bottom portion of the groove 332 has a second side S2, and the first side S1 is closer to the display area 112 compared to the second side S2. In other words, the first side S1 is located between the second side S2 and the display area 112 in the normal direction of the substrate 110. Meanwhile, at one side of the groove 332 farther from the display area 112, the second reference voltage line 240 has a third side S3, the bottom portion of the groove 332 has a fourth side S4, and the third side S3 is further farther from the display area 112 compared to the fourth side S4. A space between the first side S1 and the second side S2 is substantially equal to a space between the third side S3 and the fourth side S4.

Moreover, in the present embodiment, the third reference voltage lines 360 are formed by a film layer different from that of the second reference voltage line 240. For example, the display device 300 may further include a third insulation layer (not shown in FIG. 6), and the third insulation layer may be disposed between the film layer of the third reference voltage lines 360 and the film layer of the first reference voltage line 220. In other words, the third reference voltage lines 360 may be disposed on the substrate 110, the third insulation layer may be disposed on the third reference voltage lines 360, the first reference voltage line 220 may be disposed on the third insulation layer, the first insulation layer 330 may be disposed on the first reference voltage line 220, and the second reference voltage line 240 may be disposed on the first reference voltage line 220 and the first insulation layer 330. The third insulation layer may have a contact hole V, and the contact hole V may penetrate through the third insulation layer to facilitate the first reference voltage line 220 contacting the third reference voltage lines 360, such that one of the third reference voltage lines 360 may be electrically connected to the first reference voltage line 220 through the contact hole V. Moreover, the third insulation layer may be further configured with through holes 372, and the through holes 372 may have a structure similar to that of the through holes 272 shown in FIG. 5, so as to stabilize the structure of the first reference voltage line 220 and the second reference voltage line 240. Alternatively, the through holes 372 may avail any two film layers to be electrically connected in the display device 300, though the disclosure is not limited thereto. Therefore, based on a spatial and circuit design of the disclosure, the third reference voltage lines 360 and the second reference voltage line 240 may be formed by the same film layer, or the third reference voltage lines 360 are formed by the other film layer, which is not limited by the disclosure.

Figure 7:
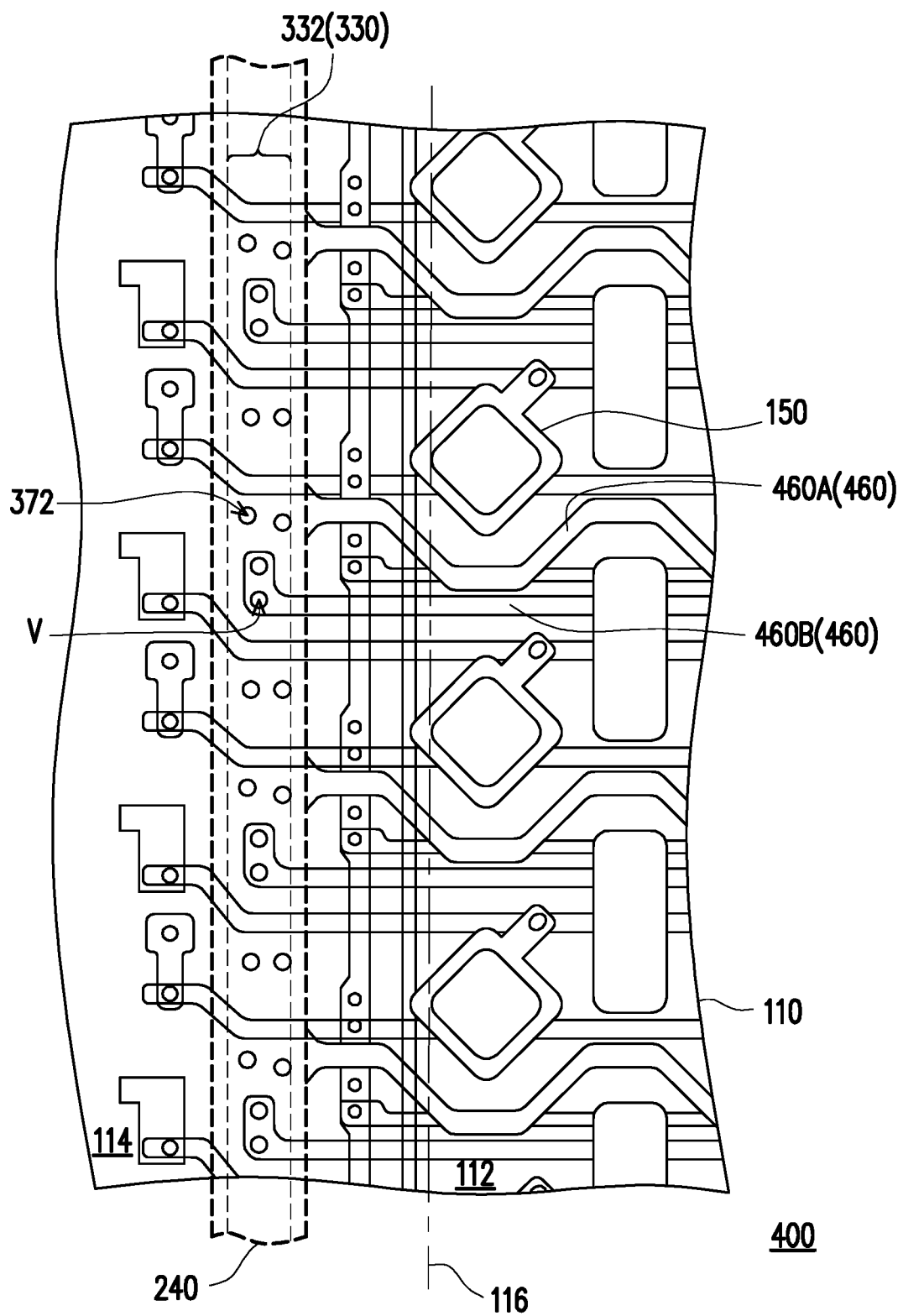
FIG. 7 is a partial top view of a display device according to still another embodiment of the disclosure.

FIG. 7 is a partial top view of a display device according to still another embodiment of the disclosure. Referring to FIG. 7, a part of components in the display device 400 is similar to that of the display device 200 and the display device 300, so that the same reference numbers are used in the two embodiments to refer to the parts having the same or similar structures. To be specific, the display device 400 includes a substrate 110, a first reference voltage line 220, a first insulation layer 330, a second reference voltage line 240, light-emitting components 150 and a plurality of third reference voltage lines 460. Structure designs and configuration relationships of the substrate 110, the first reference voltage line 220, the first insulation layer 330, the second reference voltage line 240 and the light-emitting components 150 may refer to the aforementioned embodiments, and details thereof are not repeated. In the display device 400, the third reference voltage line 460 extends towards the display area 112 and includes a third reference voltage line 460A directly extending from the second reference voltage line 240 and a third reference voltage line 460B formed by another film layer. Namely, the film layer of the third reference voltage line 460A is the same with the film layer of the second reference voltage line 240. In an embodiment, the third reference voltage line 460A may have a structure design similar to that of the third reference voltage line 160 of FIG. 1 or FIG. 4, and the third reference voltage line 460B may have a structure design similar to that of the third reference voltage line 360 of FIG. 6, though the disclosure is not limited thereto.

The third reference voltage line 460B is formed by a film layer different to that of the third reference voltage line 460A. To be specific, the film layer of the third reference voltage line 460B may be located between the first reference voltage line 220 and the substrate 110, and the film layer of the third reference voltage line 460B and the film layer of the first reference voltage line 220 may include a third insulation layer (not shown) there between. The third insulation layer may be configured with a contact hole V, such that the third reference voltage line 460B is electrically connected to the first reference voltage line 220 through the contact hole V. In an embodiment, the third reference voltage line 460B may also be electrically connected to other film layers to receive other signals, though the disclosure is not limited thereto. Moreover, the third insulation layer may be further configured with through holes 372, and the through holes 372 may have a structure similar to that of the through holes 272, so as to stabilize the structure of the first reference voltage line 220 and the second reference voltage line 240. Alternatively, the through holes 372 may be electrically connected to any two film layers in the display device 300, though the disclosure is not limited thereto.

Figure 8:
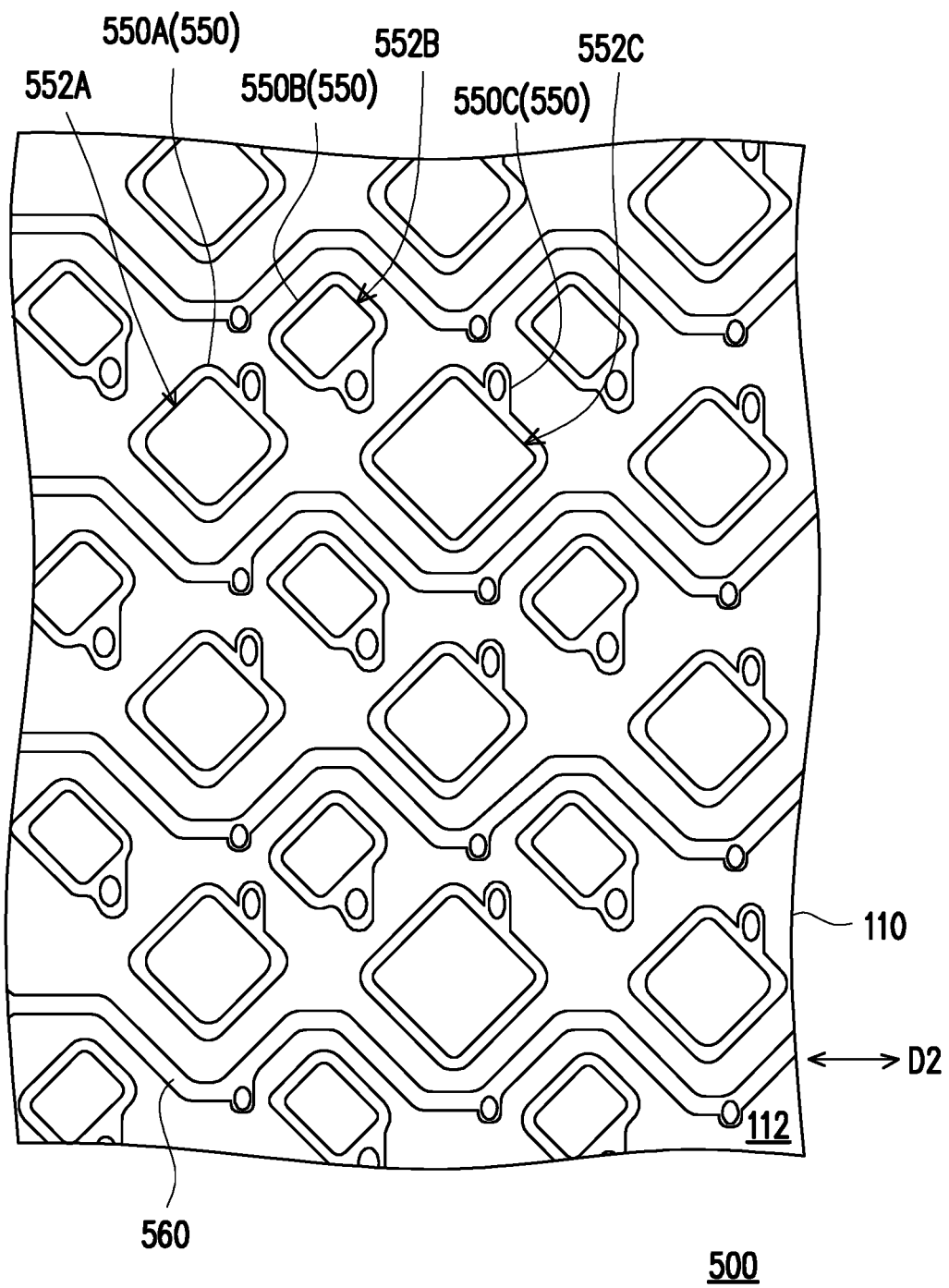
FIG. 8 is a partial top view of a display area of a display device according to an embodiment of the disclosure.

FIG. 8 is a partial top view of a display area of a display device according to an embodiment of the disclosure. Referring to FIG. 8, the display area 112 of the display device 500 includes a plurality of light-emitting components 550 and a plurality of third reference voltage lines 560. The light-emitting components 550 and the third reference voltage lines 560 are disposed on the substrate 110. The light-emitting components 550 include first light-emitting components 550A, second light-emitting components 550B and third light-emitting components 550C. In the present embodiment, the first light-emitting component 550A has a light-emitting region 552A, the second light-emitting component 550B has a light-emitting region 552B, and the third light-emitting component 550C has a light-emitting region 552C, and an area of the light-emitting region 552B may be smaller than an area of the light-emitting region 552C. The first light-emitting component 550A, the second light-emitting component 550B and the third light-emitting component 550C may be respectively a red light-emitting component, a green light-emitting component and a blue light-emitting component, though the disclosure is not limited thereto. In the present embodiment, the light-emitting components 550 located at the very edge of the display area 112 are all the first light-emitting components 550A, though the disclosure is not limited thereto. Besides, according to FIG. 8, it is known that the third reference voltage lines 560 of the present embodiment substantially extend along the second direction D2 respectively, though the third reference voltage lines 560 are zigzag lines and are not completely parallel to the second direction D2. The layout design of the light-emitting components 550 and the pattern structure of the third reference voltage lines 560 of the present embodiment may be applied to the display area 112 of any of the aforementioned embodiments.

Figure 9:
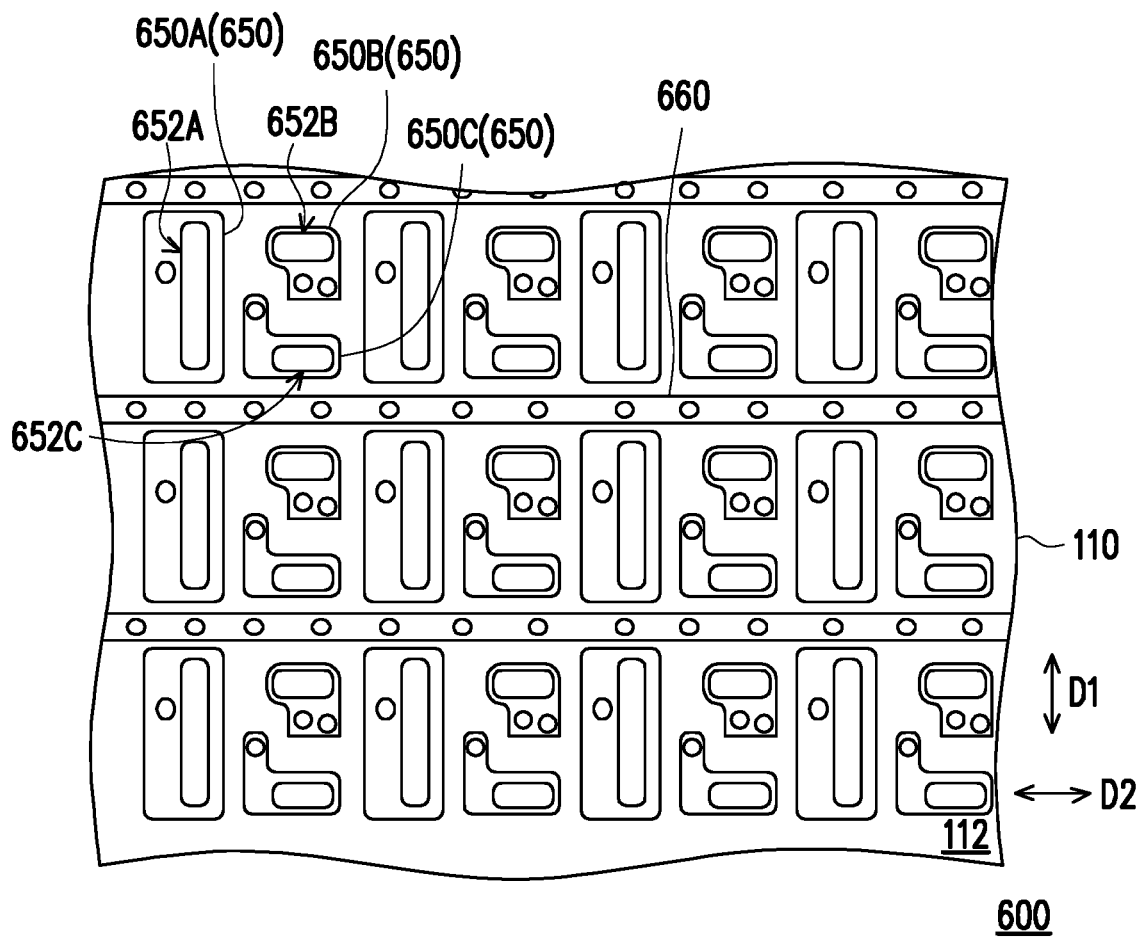
FIG. 9 is a partial top view of a display area of a display device according to another embodiment of the disclosure.

FIG. 9 is a partial top view of a display area of a display device according to another embodiment of the disclosure. Referring to FIG. 9, the display area 112 of the display device 600 includes a plurality of light-emitting components 650 and a plurality of third reference voltage lines 660. The light-emitting components 650 include first light-emitting components 650A, second light-emitting components 650B and third light-emitting components 650C. In the present embodiment, the first light-emitting component 650A has a light-emitting region 652A, the second light-emitting component 650B has a light-emitting region 652B, and the third light-emitting component 650C has a light-emitting region 652C. A long edge of the light-emitting region 652A is substantially parallel to the first direction D1, long edges of the light-emitting region 652B and the light-emitting region 652C are substantially parallel to the second direction D2, and an area of the light-emitting region 652B may be smaller than an area of the light-emitting region 652A. The first light-emitting component 650A, the second light-emitting component 650B and the third light-emitting component 650C may be respectively a blue light-emitting component, a green light-emitting component and a red light-emitting component, though the disclosure is not limited thereto. Moreover, the light-emitting components 650 located at the very edge of the display area 112 are all the first light-emitting components 650A, though the disclosure is not limited thereto. Besides, according to FIG. 9, it is known that the third reference voltage lines 660 of the present embodiment respectively extend along the second direction D2, and the third reference voltage lines 660 are straight lines substantially parallel to the second direction D2. The layout design of the light-emitting components 650 and the pattern structure of the third reference voltage lines 660 of the present embodiment may be applied to the display area 112 of any of the aforementioned embodiments (for example, FIG. 1, FIG. 4, FIG. 6, FIG. 7).

Figure 12:
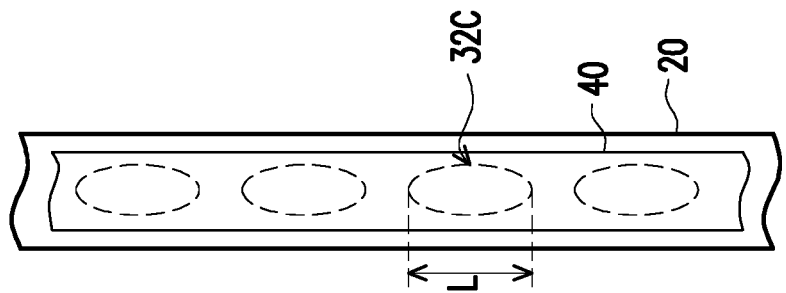
FIG. 10 to FIG. 12 are partial top views of a first reference voltage line, a second reference voltage line and grooves of a first insulation layer according to different embodiments of the disclosure.
Figure 11:
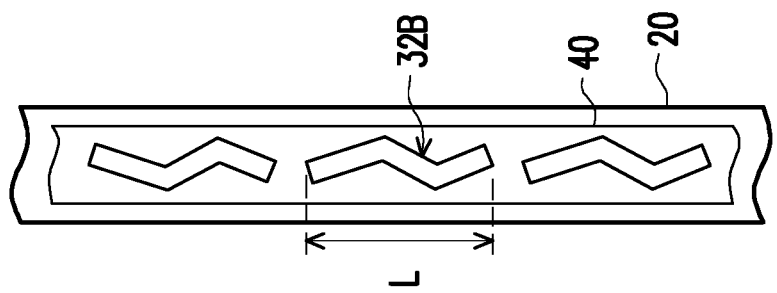
Figure 10:
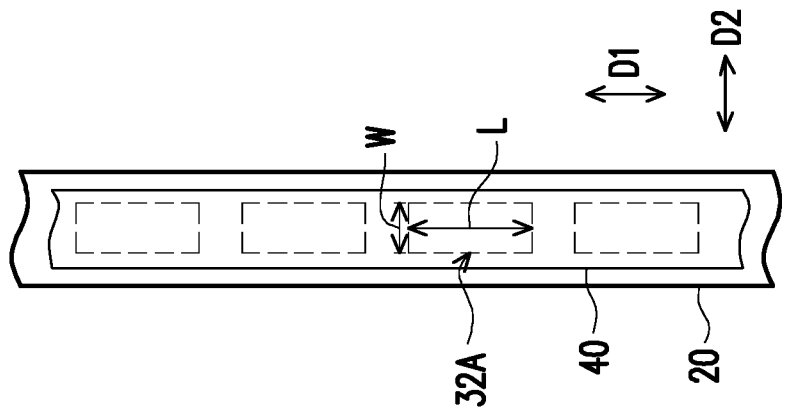

FIG. 10 to FIG. 12 are partial top views of a first reference voltage line, a second reference voltage line and grooves of a first insulation layer according to different embodiments of the disclosure. In FIG. 10 to FIG. 12, the first reference voltage line 20 and the second reference voltage line 40 substantially have a similar extending direction (for example, the first direction D1), and the first reference voltage line 20 and the second reference voltage line 40 are at least partially overlapped with each other. In the present embodiment, a line width of the first reference voltage line 20 is greater than a line width of the second reference voltage line 40, though the disclosure is not limited thereto, and in other embodiments, the line width of the first reference voltage line 20 may be equal to or smaller than the line width of the second reference voltage line 40. Moreover, the first insulation layer (not shown) may be disposed between the first reference voltage line 20 and the second reference voltage line 40, and the first insulation layer may have a plurality of grooves, for example, grooves 32A of FIG. 10, grooves 32B of FIG. 11 or grooves 32C of FIG. 12. The first reference voltage line 20 and the second reference voltage line 40 contact with each other in the grooves 32A (or the grooves 32B or the grooves 32C). The pattern design of the grooves 32A (or the grooves 32B or the grooves 32C) may have a variety of variations. For example, the grooves 32A of FIG. 10 are rectangles. The grooves 32B of FIG. 11 have zigzag profiles, for example, lightening-like grooves. The grooves 32C of FIG. 12 are oval-shape grooves. In an embodiment, according to the top view diagrams, it is known that sizes of the grooves or shapes of the grooves may be different, and a side of one of the grooves may be a curved line or only a part of the side is a curved line.

The grooves 32A (or the grooves 32B or the grooves 32C) are arranged along the first direction D1. Each of the grooves 32A (or the grooves 32B or the grooves 32C) has a groove length L in the first direction D1, and has a groove width W in the second direction D2, where the second direction D2 is substantially perpendicular to the first direction D1. Namely, each of the grooves 32A (or the grooves 32B or the grooves 32C) is a slit type groove. The structure design of the grooves 32A (or the grooves 32B or the grooves 32C) may be applied to any one of the aforementioned embodiments. When the grooves 32A (or the grooves 32B or the grooves 32C) are applied to the display device 100, the groove length L of each of the grooves 32A (or the grooves 32B or the grooves 32C) is, for example, greater than a gap between two adjacent third reference voltage lines 160.

In all of the aforementioned embodiments, some of the profiles of the components are drawn in straight lines, though the profiles of the components are not limited to be straight. For example, in FIG. 1 (the top view diagram), at least one of the first side S1 of the second reference voltage line 140 and the second side S2 of the groove 132 may be a curved line, a wavy line, a serrated line or a zigzag-shaped line, or only a part of the at least one of the first side S1 and the second side S2 may be a curved line, a wavy line, a serrated line or a zigzag-shaped line. In other words, at least a part of the first side S1 or at least a part of the second side S2 may be a curved line, a wavy line, a serrated line or a zigzag-shaped line. Moreover, at least a part of one side of at least one of the first reference voltage line and the second reference voltage line of the aforementioned embodiments may have a line structure of a curved line, a wavy line, a serrated line or a zigzag-shaped line.

In summary, the reference voltage lines disposed in the peripheral area of the display device of the disclosure may include the first reference voltage line and the second reference voltage line. The first reference voltage line and the second reference voltage line are at least partially overlapped and contact with each other through the groove in the first insulation layer, which avails increasing a cross-sectional area of a transmission path of the reference signal to improve the signal transmission efficiency. A width design of the contact surface of the first reference voltage line and the second reference voltage line in the display device of the disclosure may ensure the contact between the first reference voltage line and the second reference voltage line and decrease of a depletion of the current transmitted there between. Therefore, the display device has good quality.

It will be apparent to those skilled in the art that various modifications and variations can be made to the structure of the disclosure without departing from the scope or spirit of the disclosure. In view of the foregoing, it is intended that the disclosure cover modifications and variations of this invention provided they fall within the scope of the following claims and their equivalents.

What is claimed is:

1. A display device, comprising:
a substrate, having a display area and a peripheral area located adjacent to the display area;
a first reference voltage line, disposed on the substrate and located in the peripheral area, the first reference voltage line extending along a first direction, wherein the first reference voltage line has a contact portion and a first covered portion, and the first covered portion is located between the contact portion and the display area;
a first insulation layer, disposed on the first reference voltage line, and the first insulation layer having a groove, wherein the groove extends along the first direction, the groove exposes the contact portion, and the first insulation layer covers the first covered portion; and
a second reference voltage line, disposed on the first reference voltage line and located in the peripheral area, the second reference voltage line extending along the first direction and at least partially overlapped with the first reference voltage line, wherein the second reference voltage line contacts the contact portion of the first reference voltage line at the groove and has a contact surface,
wherein a second direction is perpendicular to the first direction, a first width of the contact surface in the second direction is $W_1$ μm, a second width of the first reference voltage line in the second direction is $W_2$ μm, and a third width of the first covered portion in the second direction is $W_3$ μm, and $W_1$, $W_2$, $W_3$ are complied with a relational expression:

$$1 \text{ μm} \leq W_1 \leq (W_2 - W_3), \text{ and } W_3 \text{ is greater than 0 and smaller than } W_2/3.$$

2. The display device as claimed in claim 1, wherein the first reference voltage line has a first thickness, the second reference voltage line has a second thickness, and the first thickness is greater than the second thickness.

3. The display device as claimed in claim 1, further comprising a second insulation layer disposed between the first reference voltage line and the substrate, and the second insulation layer having a through hole, wherein a part of the first reference voltage line and a part of the second reference voltage line are disposed in the through hole, and at least a part of the through hole is overlapped with the groove.

4. The display device as claimed in claim 1, wherein the second reference voltage line has a first side, a bottom portion of the groove has a second side, and the first side and the second side are both located at one side of the groove and located adjacent to the display area, wherein the first side is located between the second side and the display area.

5. The display device as claimed in claim 4, wherein at least a part of the first side or at least a part of the second side is a curved line.

6. The display device as claimed in claim 1, further comprising a plurality of third reference voltage lines disposed on the first insulation layer, wherein the third reference voltage lines are respectively connected to the second reference voltage line and extend from the peripheral area to the display area, and the third reference voltage lines respectively extend along the second direction.

7. The display device as claimed in claim 6, wherein a line width of the second reference voltage line in the second direction is greater than a line width of at least one of the third reference voltage lines in the first direction.

8. The display device as claimed in claim 6, wherein the groove has a groove length in the first direction, two adjacent third reference voltage lines are spaced by a first distance, and the groove length is greater than the first distance.

9. The display device as claimed in claim 1, wherein the first insulation layer has a plurality of grooves.

10. The display device as claimed in claim 9, wherein sizes of two of the grooves are different.

11. The display device as claimed in claim 9, wherein a side of one of the grooves comprises a curved line.

12. The display device as claimed in claim 1, wherein the first reference voltage line further comprises a second covered portion, and the first covered portion and the second covered portion are covered by the first insulation layer and located at two opposite sides of the contact portion.

13. The display device as claimed in claim 12, wherein the groove has an inner sidewall close to the display area and an outer sidewall farther from the display area on a cross-section of the display device taken in the second direction, and the second reference voltage line covers the inner sidewall, wherein the inner sidewall is disposed corresponding to the first covered portion, and the outer sidewall is disposed corresponding to the second covered portion.

14. The display device as claimed in claim 13, wherein the inner sidewall has a first tilt angle relative to a surface of the first covered portion, and the surface of the first covered portion is adjacent to the inner sidewall, the outer sidewall has a second tilt angle relative to a surface of the second covered portion, and the surface of the second covered portion is adjacent to the outer sidewall, wherein the first tilt angle and the second tilt angle are different.

15. The display device as claimed in claim 14, wherein the first tilt angle is smaller than the second tilt angle.

16. The display device as claimed in claim 1, wherein the second reference voltage line comprises a middle portion, an inner portion and an outer portion, the middle portion is located in the groove and contacts the first reference voltage line, the inner portion and the outer portion are respectively located at two sides of the middle portion and disposed on the first insulation layer, and the inner portion is located between the middle portion and the display area.

17. The display device as claimed in claim 1, further comprising a plurality of third reference voltage lines each extending along the second direction, wherein the third reference voltage lines are electrically connected to the second reference voltage line respectively and extend from the peripheral area to the display area.

18. The display device as claimed in claim 17, further comprising a third insulation layer located between the third reference voltage lines and the first reference voltage line, and the third insulation layer having a contact hole, wherein one of the third reference voltage lines is electrically connected to the first reference voltage line through the contact hole.

19. The display device as claimed in claim 1, wherein a width of the groove is smaller than a width of the first reference voltage line.

* * * * *